United States Patent
Ahuja

[19]

[11] Patent Number: 5,886,657
[45] Date of Patent: Mar. 23, 1999

[54] SELECTABLE REFERENCE VOLTAGE CIRCUIT FOR A DIGITAL-TO-ANALOG CONVERTER

[75] Inventor: Bhupendra K. Ahuja, Fremont, Calif.

[73] Assignee: C-Cube Microsystems, Milpitas, Calif.

[21] Appl. No.: 918,524

[22] Filed: Aug. 21, 1997

[51] Int. Cl.$^6$ .................................................. H03M 1/66
[52] U.S. Cl. ............................................. 341/144; 327/1
[58] Field of Search ................................... 341/144, 120; 327/1, 90

[56] References Cited

U.S. PATENT DOCUMENTS

| | | | |
|---|---|---|---|
| 3,653,037 | 3/1972 | Utley | 341/120 |
| 4,752,700 | 6/1988 | Boyaciqiller | 307/297 |
| 4,797,569 | 1/1989 | Boyaciqiller | 327/545 |
| 5,532,618 | 7/1996 | Hardee et al. | 326/63 |
| 5,619,461 | 4/1997 | Roohparvar | 365/201 |
| 5,719,524 | 2/1998 | Mo et al. | 327/545 |

*Primary Examiner*—Marc S. Hoff
*Assistant Examiner*—Peguy Jean-Pierre
*Attorney, Agent, or Firm*—Fish & Richardson, P.C.

[57] ABSTRACT

A selectable reference voltage circuit for a digital-to-analog converter (DAC) which includes an input terminal for receiving an external reference voltage, a voltage comparator having two inputs and an output, one input for receiving the reference voltage and the other for receiving a predetermined voltage, the comparator providing one of two possible output voltages based upon the relationship of the magnitudes of the reference voltage and the predetermined voltage. The circuit includes a multiplexer having a control input coupled to receive as an input signal the output of the comparator, and having two inputs for receiving input voltage signals, one for receiving the voltage on the reference voltage input terminal and the other for receiving an on-chip generated reference voltage, the multiplexer selecting as an output voltage one of the two input voltages determined by the input signal at its control input. When there is a reference voltage at the reference voltage input terminal of the DAC, that voltage is supplied at the output of the multiplexer and used as the reference voltage for the DAC. When there is no reference voltage at the reference voltage input terminal of the DAC, the internally generated reference voltage is supplied at the output of the multiplexer and is used as the reference voltage of the DAC.

7 Claims, 1 Drawing Sheet

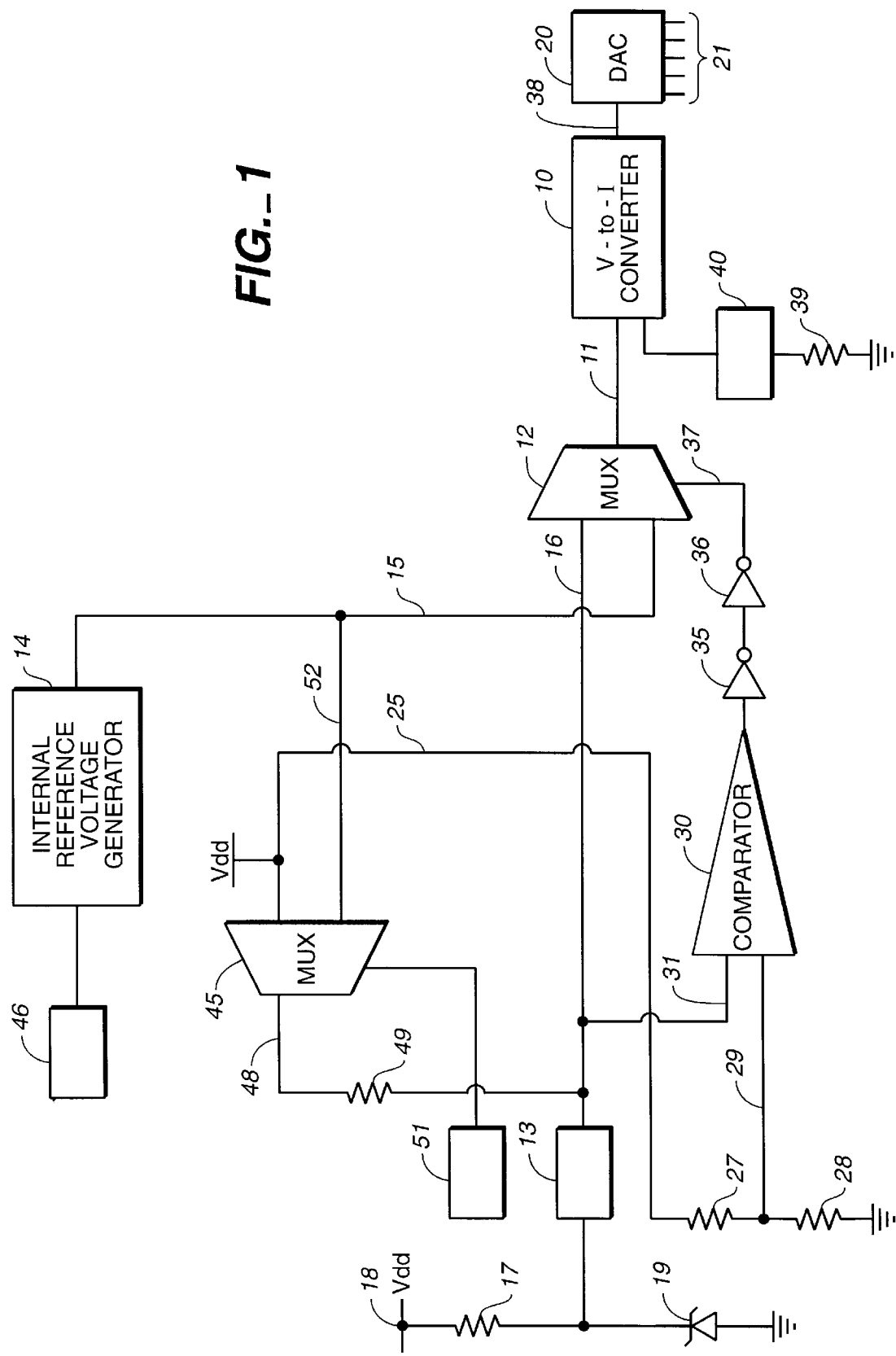
FIG._1

SELECTABLE REFERENCE VOLTAGE CIRCUIT FOR A DIGITAL-TO-ANALOG CONVERTER

BACKGROUND AND PRIOR ART OF THE INVENTION

This invention relates to a method and apparatus for providing a selectable reference voltage for a monolithic digital-to-analog converter (DAC). A reference current is typically generated by a voltage-to-current (V-to-I) converter from a reference voltage. In the prior art, the reference voltage is provided to the V-to-I converter of the DAC in one of two ways. It is either provided externally and connected to an input terminal of the DAC, or it is generated internally on the chip using an on-chip voltage reference generator.

Prior art DACs do not provide for the possibility of using either an internal on-chip reference voltage generator circuit or, in the alternative, an off-chip reference voltage source. The purpose of this invention is to provide a DAC which can accept, in the alternative, either an on-chip reference voltage or an externally generated reference voltage.

SUMMARY OF THE INVENTION

The selectable reference voltage circuit of the invention for a DAC is capable of selecting between an external reference voltage source and an internally generated on-chip reference voltage. The chip has a reference voltage input terminal for receiving a reference voltage from a reference voltage supply, and a voltage comparator having two inputs and an output, one input for receiving the voltage at the input terminal and the other for receiving a predetermined voltage. The comparator provides one of two possible output voltages based upon the relationship of the magnitudes of the voltage at the input terminal and the predetermined voltage. In addition, the DAC of the invention has a multiplexer having a control input coupled to receive as an input signal the output of the comparator, and having two inputs for receiving input voltage signals, one for receiving the voltage on the reference voltage input terminal and the other for receiving an on-chip generated reference voltage, the multiplexer selecting as an output voltage one of the two input voltages determined by the input signal at its control input, whereby, when there is a reference voltage at the reference voltage input terminal of the DAC, that voltage is supplied at the output of the multiplexer and used as the reference voltage of the DAC, and when there is no reference voltage at the reference voltage input terminal of the DAC, the internally generated reference voltage is supplied at the output of the multiplexer and used as the reference voltage for the DAC.

Preferably, the predetermined voltage is intermediate the external reference voltage and the positive supply voltage for the DAC.

In addition, the DAC of the invention includes circuitry for a test mode to allow testing of the stability and temperature characteristics of the internal reference voltage generator. Preferably the same input terminal of the chip, or "pin", is used both for the input for the external reference voltage and as an output terminal for testing the internal reference voltage generator.

BRIEF DESCRIPTION OF THE DRAWING

FIG. 1 is a schematic and block diagram of the selectable reference voltage circuit of the invention.

DESCRIPTION OF THE PREFERRED EMBODIMENTS

The DAC of the invention is shown in FIG. 1. In order to operate properly, a DAC, formed as a monolithic integrated circuit, must have a reference current available on the chip. Most DACs, particularly video DACs of the preferred embodiment of this invention, are current-summing DACs. As such, they require a reference current rather than a reference voltage. In the DAC of the preferred embodiment of the invention, the reference current is generated from a reference voltage by voltage-to-current converter 10, using as the input voltage the voltage on line 11. The reference current is fed through line 38 to DAC 20. The input signals to DAC 20 are input to input lines 21.

Multiplexer (MUX) 12 makes a selection between its input voltages, to provide the voltage to be input to V-to-I converter 10. The two choices available at the inputs to MUX 12 are an externally supplied reference voltage input to the MUX from pin 13 along line 16, and an internally generated reference voltage generated by on-chip voltage generator 14. The internally generated reference voltage appears on line 15 and is input to MUX 12.

The reference voltage, both the externally supplied one and the internally generated one, is a known, fixed voltage value, for example, 1.235 volts. As is known in the art, with a properly sized resistor 17, for example, and a voltage $V_{dd}$ of about 3.3 volts on terminal 18, using a bandgap reference zener diode 19 connected as shown between resistor 17 and ground, a reference voltage of 1.235 volts will be generated at terminal 13. This voltage is the externally supplied reference voltage for the DAC. On the other hand, if the bandgap reference zener 19 is not present, thereby eliminating the externally generated reference voltage, pin 13 will have the voltage of $V_{dd}$ at terminal 18, for example, 3.3 volts.

The same $V_{dd}$ of 3.3 volts is also applied at terminal 25. Balancing resistors 27 and 28, if properly sized as known in the art, will result in a voltage of about 2.1 volts on line 29, which is one of two inputs of comparator 30. For example, resistor 27 may be 12 ohms and resistor 28 may be 21 ohms. The other input to comparator 31 comes from terminal 13 which is connected to the external reference voltage. The voltage on terminal 13 will be 1.235 volts if the reference bandgap zener 19 is present; otherwise terminal 13 is pulled high by resistor 17 to the voltage $V_{dd}$ on terminal 18, which is 3.3 volts.

Comparator 30 compares the voltage at terminal 13 with the fixed predetermined voltage of 2.1 volts on line 29. The predetermined voltage on line 29 must be set in between the two possible voltages on pin 13. If the bandgap zener 19 coupled to pin 13 is present, the external reference voltage of 1.235 appears at terminal 13 and at input 31 of comparator 30. That voltage is generated using zener diode 19 which functions as a bandgap reference. If the bandgap reference 19 is absent, a voltage $V_{dd}$ of approximately 3.3 volts on line 31. 2.1 volts always appears on line 29 as a result of balancing resistors 27 and 28.

Comparator 30 makes a determination as to whether the voltage on line 31 is higher or lower than the predetermined voltage on line 29 (2.1 volts in the example). If the bandgap reference 19 is present, the voltage on line 31 is 1.235 volts, which is lower than the 2.1 volts on line 29. If the bandgap reference 19 is absent, the voltage on line 31 is about 3.3 volts, which is higher than 2.1 volts. If the voltage on line 31 is higher than voltage on line 29, that indicates that the bandgap reference 19 is absent; if the voltage on line 31 is lower than voltage on line 29, the bandgap reference 19 must be present.

The output of comparator 30 is fed through two inverters 35 and 36, which create a delay, to provide a control input signal to MUX 12 on line 37. If comparator 30 has detected the presence of an external reference voltage at terminal 13, the resulting control signal on line 37 to MUX 12 will cause MUX 12 to output that external reference voltage, which also appears on line 16 connected to terminal 13. On the other hand, if the output signal from comparator 30 on line 37 indicates there is no external reference voltage connected to pin 13, the signal on line 37 will control MUX 12 to output onto line 11 the internally-generated reference voltage on line 15 generated by on-chip internal reference voltage generator 14. The output voltage from MUX 12 on line 11 is fed to V-to-I converter 10. V-to-I converter 10 converts the reference voltage to a reference current, and outputs that reference current to the DAC 20 on line 38. As is known in the art, such current reference generators use a grounded precision external resistor 39 connected to terminal 40, which preferably is connected to the DAC through an external pin 40.

A preferred embodiment of the invention provides a way of testing the stability and temperature characteristics of the internal reference generator at the same pin 13 used to bring in the external reference voltage. To accomplish this, an output signal from internal voltage generator 14 is fed to an input of MUX 45. To place the circuit in the test mode, a test signal is input to the DAC at pin 51. In the test mode, the test input signal at pin 51 causes MUX 45 to output on line 48 the internally-generated reference signal from voltage generator 14, which is passed through line 52 to MUX 45. MUX 45 selects the signal on line 52 from voltage generator 14, which appears on output line 48 and at pin 13 through resistor 49. Resistor 49, between the output of MUX 45 and terminal 13, acts as a protection bias resistor in case a user fails to connect a resistor, such as resistor 17, to terminal 13 in order to properly bias that terminal.

In the test mode, terminal 13 is left floating and no external bandgap reference generator 19 will be connected to it. Accordingly, when a test signal is applied to terminal 51, on-chip voltage generator 14 sends the internal reference voltage on line 52 through MUX 45, through MUX output line 48, biased by resistor 49, for example 5000 ohms, to terminal 13 where the reference voltage can be tested for its stability and temperature characteristics.

As will be understood by those skilled in the art, many changes in the method and apparatus described above may be made by the skilled practitioner without departing from the spirit and scope of the invention, which should be limited only as set forth in the claims which follow.

What is claimed is:

1. A digital-to-analog converter circuit (DAC) which includes on the same semiconductor chip a selectable reference voltage circuit powered by a voltage $V_{dd}$ comprising:

a reference voltage input terminal for receiving a fixed external reference voltage, the input terminal remaining floating when the fixed external reference voltage is not present;

a voltage comparator having two inputs and an output, one input for receiving the voltage at the input terminal and the other for receiving a fixed, predetermined internally generated voltage between $V_{dd}$ and the fixed external reference voltage, the comparator providing one of two possible output voltages based upon the relationship of the magnitudes of the voltage on the input terminal and the internally generated voltage;

a multiplexer having a control input coupled to receive as an input signal the output voltage of the comparator, and having two inputs, one for receiving the voltage on the input terminal and the other for receiving the internally generated voltage, the multiplexer providing as a reference voltage for the DAC one of the two input voltages determined by the input signal at its control input, whereby, when the fixed reference voltage is present on the input terminal, that voltage is provided at the output of the multiplexer as the reference voltage for the DAC, and when there is no such fixed reference voltage and the input terminal is floating, the internally generated voltage is provided by the multiplexer as the reference voltage for the DAC.

2. The DAC of claim 1 wherein the internally generated voltage is intermediate two possible voltages which, in the alternative, may be present on the input terminal.

3. The DAC of claim 1 further including a V-to-I converter for converting the voltage provided by the multiplexer to current.

4. The DAC of claim 1 further comprising a switch having a control input controlled by a test signal which when present sends the internally generated voltage to the input terminal, whereby the stability of the internally generated voltage may be tested external to the DAC through the input terminal when there is no external reference voltage on the input terminal.

5. The selectable reference voltage circuit of claim 4 wherein the switch is a second multiplexer.

6. The selectable reference voltage circuit of claim 4 wherein the test signal is applied at an external test input terminal.

7. The DAC of claim 4 wherein the input terminal serves three alternative purposes: (1) as a reference voltage input terminal; (2) as a test terminal for testing the internally generated voltage; or (3) as a floating terminal.

* * * * *